United States Patent [19]
Packeiser et al.

[11] Patent Number: 4,739,388
[45] Date of Patent: Apr. 19, 1988

[54] INTEGRATED CIRCUIT STRUCTURE FOR A QUALITY CHECK OF A SEMICONDUCTOR SUBSTRATE WAFER

[75] Inventors: Gerhard Packeiser, Kirchheim; Helmut Schink, Munich, both of Fed. Rep. of Germany; Gerard M. Martin, Paris; Jose Maluenda, Boissy Saint Leger, both of France

[73] Assignees: Siemens Aktiengesellschaft, Berlin and Munich, Fed. Rep. of Germany; U.S. Philips Corp., New York, N.Y.

[21] Appl. No.: 900,903

[22] Filed: Aug. 27, 1986

[30] Foreign Application Priority Data

Aug. 27, 1985 [DE] Fed. Rep. of Germany ....... 3530578

[51] Int. Cl.$^4$ ............... H01L 21/66; H01L 29/44; H01L 29/52
[52] U.S. Cl. ..................... 357/68; 357/23.1; 357/45; 324/158 T; 324/158 R
[58] Field of Search ............ 357/68, 23.1, 45; 324/158 T, 158 R

[56] References Cited

U.S. PATENT DOCUMENTS

| | | | |
|---|---|---|---|
| 3,983,479 | 9/1976 | Lee et al. | 324/158 R |
| 4,034,399 | 7/1977 | Drukier | 357/68 |
| 4,144,493 | 3/1979 | Lee et al. | 324/158 T |
| 4,288,911 | 9/1981 | Ports | 324/158 T |
| 4,516,071 | 5/1985 | Beuhler | 324/158 R |
| 4,538,105 | 8/1985 | Ausschnitt | 324/158 R |
| 4,584,595 | 4/1986 | Kammiller | 357/68 |

FOREIGN PATENT DOCUMENTS 58-144 1/1983 Japan ..................... 357/45
58-159341 9/1983 Japan ..................... 357/68

OTHER PUBLICATIONS

"A Joint Course: Designing with ULA's, Part 1: Technology and Circuit Elements", Elec. Engr., vol. 54, No. 663, Mar. 1982, pp. 53–57.
"Introduction of an Ultra Fast 8000-Gate CMOS Gate Array", the 2nd Intl. Conference on Semi-Custom ICs, Nov. 1982, pp. 1–7.

*Primary Examiner*—Andrew J. James
*Assistant Examiner*—Jerome Jackson, Jr.
*Attorney, Agent, or Firm*—Hill, Van Santen, Steadman & Simpson

[57] ABSTRACT

An integrated circuit structure to be built on a semiconductor substrate wafer for the purpose of undertaking a quality check of the wafer has a plurality of field effect transistors laterally disposed in the same close adjacency as transistors which are to be manufactured on a chip using the wafer material. Each field effect transistor has its own well structure, its own source structure, and its own drain structure. The individual field effect transistors have pads allocated thereto at an edge of the structure. Each transistor source/drain structure is connected to the pads by a conductor, the totality of these conductors having width and/or length dimensions so that each run has approximately the same resistance. Only one common gate conductor for all of the transistors is provided.

8 Claims, 3 Drawing Sheets

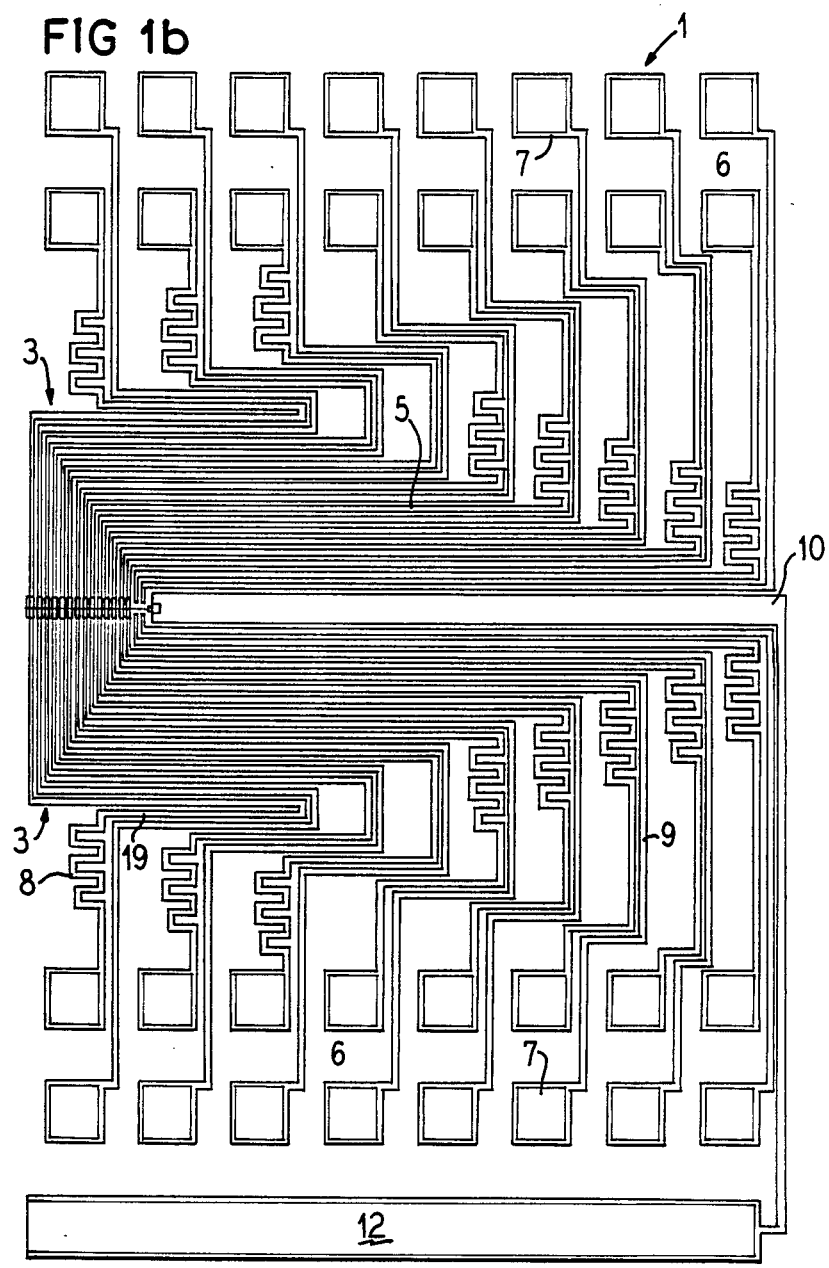

INTEGRATED CIRCUIT STRUCTURE FOR A QUALITY CHECK OF A SEMICONDUCTOR SUBSTRATE WAFER

BACKGROUND OF THE INVENTION

1. Field of the Invention

The present invention relates to an integrated circuit structure built on a substrate wafer manufactured from a larger semiconductor crystal, for the purpose of undertaking a quality check of the wafer material. In particular, the structure encompasses field effect transistors, interconnecting conductors and pads.

2. Description of the Prior Art

Circuit elements and technology for testing certain types of integrated circuits are described, for example, in "Electronic Engineering," Vol. 54, No. 663, March 1982 at pages 53–57. General teachings regarding integrated circuit examples are provided therein, for example, gate arrays, master slices, and logic arrays. The structures and techniques described in this article are directed to designing the interconnection of the individual semiconductor functional elements forming an array. Details regarding line management of such integrated circuits to be employed in practice are also described.

An introduction to ultra-fast 8000-gate CMOS gate arrays is provided in "The 2nd International Conference on Semi-Custom ICs," November 1982, at pages 1–7. LSI circuits are also discussed in this publication, particularily techniques for realizing such circuits on semiconductor chips of corresponding size. As described in this publication, it is important that the material of a semiconductor chip carrying the LSI circuit have uniformity and freedom from defects such that every individual functional element of the integrated circuit is operational. The outage of even a single function can make the entire integrated circuit or the entire semiconductor chip worthless.

For this reason, it is standard practice to check substrate wafers, which are to be employed for semiconductor circuits, for their operability and freedom from defects before undertaking manufacture of the actual semiconductor chips. The substrate wafers which are tested is a relatively large diameter, but extremely thin, wafer. Such wafers may have a diameter of up to a few inches and are produced from a grown semiconductor crystal such as, for example, by sawing. Such a semiconductor crystal is divided into such substrate wafers by a plurality of parallel saw cuts. The quality check is usually executed in the form of spot checks. It has been shown that the result of the quality check of one substrate wafer provides valid evidence for the quality of substrate wafers produced in the proximate region from the same crystal.

A known method for performing such a quality check is to produce a structure on the substrate surface specifically for this purpose, the structure comprising field effect transistor structures in a grid spacing of approximately 200 μm, which are immediately surrounded by the terminal pads. The source/drain region of one transistor also functions as the source/drain region of the neighboring transistor, so that only one terminal pad for both source/drain regions need be present in the lateral direction between two neighboring gate regions. This is advantageous because the terminal pad is relatively large in area. The full surface of a single substrate wafer is covered with such a structure, and thus the entirety of the wafer surface is checked using the specified grid dimension. Conclusions regarding a greater number of substrate wafers cut in proximate fashion from the same crystal can then be drawn from the substrate wafer which was checked. A smaller excerpted region having such a structure can be checked on a substrate wafer with respect to quality, this excerpted region (as the individual substrate wafer described above) is then no longer available for production of integrated circuits, and is discarded.

The result of the quality check achieved with the grid dimension as described above and for variations thereof is relatively satisfactory, particularly if the semiconductor material is silicon. A more sophisticated quality check is required, however, for III-V semiconductor material (gallium arsenide, gallium phosphide, indium phosphide and the like, as well as ternary and quaternary semiconductor material such as gallium aluminum arsenide, gallium arsenide phosphide and the like). It is known that for binary, ternary and quaternary III-V semiconductor materials, a 200 μm grid is inadequate to discover many quality defects with sufficient reliability. The assumption that the quality, or lack thereof, of a tested substrate wafer will be the same for other substrate wafers cut from the proximate region of the same crystal is, however, still valid.

SUMMARY OF THE INVENTION

It is an object of the present invention to provide a structure for use in undertaking a quality check of III-V semiconductor material which provides reliable results.

The above object is achieved in accordance with the principles of the present invention using a structure which has a component density which is at least the same, or greater than, the density of the grid of the individual functional elements which are to be included in an integrated circuit to be manufactured from the substrate wafer being tested. Only when the quality check is undertaken with such a fineness can adequately reliable statements be made with respect to the substrate wafer being checked, and with respect to other substrate wafers cut from the same crystal in the proximate region of the tested wafer. The circuit structure described herein has a plurality of field effect transistor structures which are laterally arranged in the same proximity next to each other as will be field effect transistors in an integrated circuit to be manufactured on a chip from the material being tested. It is sufficient to check with this degree of fineness along one direction on the substrate surface. It is preferable, however, to execute the quality check with a plurality of structures in accordance with the principles of the present invention oriented on the substrate wafer in various directions.

One may also proceed, in accordance with the principles of the present invention, by checking the single substrate wafer across its entire surface using structures as described herein (arranged next to each other). One may also proceed by checking only one portion of the surface. Those skilled in the art will be able to determine the extent to which such checking is sufficient to meet the individual requirements of different purposes and environments in which the chip ultimately manufactured from the substrate wafer is to be used.

Individual lead connections are required for the source structure and for the drain structure of each individual field effect transistor structure. In accordance with the principles of the present invention, only the gate structures of all, or at least a majority of, the field effect transistors are electrically connected to each other. Each individual lead conductor, at its terminal end (which is its free end away from the field effect transistor structure) is connected to a terminal pad which can be used, for example, for attachment of test probes. These terminal pads are arranged in the edge region of the overall structure disclosed herein. This means that at least some of the source structures and/or drain structures of the individual field effect transistors have lead interconnections between the structures and their pads, these lead connections being of a relatively long length. It is therefore provided that all of the conductors connecting a source/drain structure to a terminal pad are dimensioned to have a resistance of approximately the same value. Since the length is relatively fixed, this is achieved by appropriate width and/or thickness dimensions for the individual conductor. It is also possible, however, to provide additional length for the conductor by adding a meandering structure for a particular conductor.

A single lead connection is adequate by itself for the gate structures, however, it is preferable to use two such conductors connected to the gate structures (which are arranged next to each other) from both sides, and being connected to each other in the region of these gate structures. This also has the advantage that any interruption of the gate connection which may inadvertently arise in the region of the gate structures will have little disadvantageous influence. A Schottky contact is provided for connection to the gate structures, that is, for the gate contact to the semiconductor material of the substrate wafer.

In accordance with the principles of the present invention, no insulation layer is provided on the surface of the substrate layer, and no etched structure need be applied to the surface thereof. Due to stresses or voltages, for example, which may be produced in the semiconductor material, applied insulated layers and/or inserted etched structures may give false results with respect to the quality of the original substrate wafer.

The omission of insulation layers requires that the connecting conductors be arranged so as not to cross over each other.

The inventive concept disclosed herein may be used in other embodiments. For example, the structure disclosed herein can be applied to a substrate wafer wherein the basin structures and source/drain structure (diffused or implanted) are doped regions of the surface of the substrate wafer, the gate structures are Schottky contacts, and the interconnecting conductors and pads are metallized coatings on the surface of the substrate wafer. This embodiment of the invention is best suited for executing the above-described quality check.

Manufacture of the structure disclosed herein on the surface of the substrate wafer can be executed by the use of masks and/or by the use of a beam inscription method (for example, electron beam inscription). Accordingly, the invention may be embodied in a set of masks which are used for manufacturing the structure on the substrate surface. For example, a first mask may contain the geometrical boundaries of the well structure. A second mask may contain the geometrical boundaries of the source/drain regions. These two masks are used in doping or implantation steps. Another mask may contain the structure of the conductors and pads, this mask being employed in a vapor-deposition or sputtering step. Another mask may have the boundaries of the gate structures.

DESCRIPTION OF THE DRAWINGS

FIGS. 1a and 1b together constitute a plan view of the overall structure for conducting a quality check of a substrate wafer constructed in accordance with the principles of the present invention.

FIG. 2 is a plan view, greatly enlarged, of a central region of the structure shown in FIG. 1 showing four field effect transistors arranged side by side.

FIG. 3 is a schematic plan view showing a substrate wafer wherein the structure shown in FIGS. 1a and 1B has been applied at designated portions oriented in different directions.

DESCRIPTION OF THE PREFERRED EMBODIMENTS

Figure 1A:
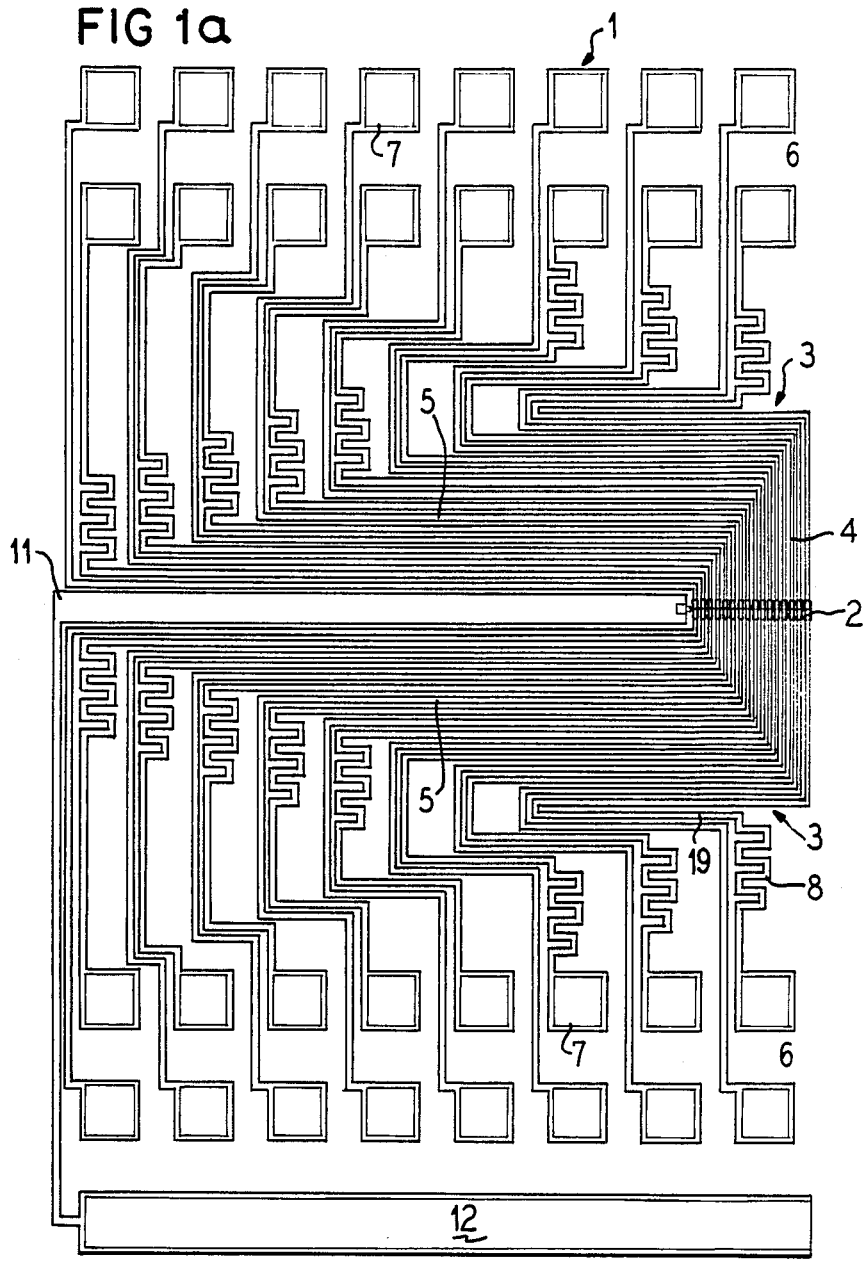

The overall structure 1 for conducting a quality check of a substrate wafer in accordance with the principles of the present invention is shown in FIGS. 1a and 1b, in combination. The strips referenced 2 indicate a plurality of field effect transistor structures, for example 30 such structures, arranged laterally in close proximity to each other. For clarity, the individual transistor structures are shown in FIGS. 1a and 1b as a strip without greater detail, the details lacking in FIGS. 1a and 1b being shown enlarged in FIG. 2. The center-to-center spacing of two field effect transistor structures in each strip 2 is in the range of, for example, about 5 through about 20 $\mu$m, preferably 10 $\mu$m. The width of an individual field effect transistor structure is in the range of, for example, about 3 through about 10 $\mu$m, preferable 5 $\mu$m. A lateral spacing of, for example, about 2 through about 10 $\mu$m, preferable 5 $\mu$m, derives therefrom for the interconnecting conductors in the region of the terminals to the source/drain structures, these interconnections being discussed below.

The totality of interconnecting conductors is referenced at 3 in FIGS. 1a and 1b. The portion of this totality which encompasses the parts of the interconnections disposed close to the source/drain regions is referenced 4. The contact connection between a particular conductor and its associated single source/drain structure of one field effect transistor is situated at the boundary of the portion 4 with respect to the strips 2. The region 4 is divided into the two portions shown in FIGS. 1a and 1b (above and below the strip 2). The individual conductors have a relatively small width in the region 4.

Broader conductors can be provided in the sub-region 5 of the totality 3 of conductor runs. Terminal pads 7 are located at edge regions 6 of the structure. Paths 19 including meandering segments 8 may be provided to equalize the resistance of conductor runs. Straight paths 9 can also be used for this purpose by suitable dimensioning.

The two portions of a gate lead interconnect to which the terminal pad 12 is connected are referenced 10 and 11. The two interconnects 10 and 11 lead to the strip 2, consisting of field effect transistor structures, from each side. As can be seen in greater detail in FIG. 2, both interconnects 10 and 11 merge into a common gate interconnect in the region of the strip 2.

It is clear that the structure of FIGS. 1a and 1b permits every individual field effect transistor structure to be separately tested, and moreover permits the value for the threshold voltage thereof, which is especially important for quality evaluation, to be individually identified. The topical density of the individual checks (in the surface region of the strip 2) has a density which is at least as large as that for the individual functional elements in an integrated circuit of a chip to be manufactured from the substrate wafer being tested.

FIG. 2 shows an enlarged view of a portion of the strip 2 of FIGS. 1a and 1b. A well structure 23 is provided for each field effect transistor 21. The well structure 23 may be a doped region in the substrate wafer, the substrate wafer usually being insulating or of at least relatively high resistance material. The source/drain structures 22 are arranged within a well structure 23. These regions also are doped in accordance with integrated circuit techniques, and shall be referred to below as doped regions of the substrate wafer. A gate interconnect 24 merges with the interconnect 10, and the interconnect 11, at its two ends (at the right and left of FIG. 2). The actual gate regions or gate structures of the individual field effect transistors are referenced 25. The aforementioned Schottky contact for the gate develops its intended effect at that region. The terminal ends of the interconnect structure, which lead to the source/drain structures, are referenced 26 and 27. These interconnect structures 26 and 27 merge with the interconnect structure 4 in FIGS. 1a and 1b.

A substrate wafer 30 is shown in FIG. 3 having, for example, a diameter of two inches. Three regions 31 of the surface of the substrate wafer 30 are shown in FIG. 3 for implementing a quality check with a structure of the present invention as described above constructed on the surface of the substrate 30. The structure is schematically referenced at 1, with an arrow indicating the orientation of the structure 1 (as shown in FIGS. 1a and 1b) in each region 31. Although modifications and changes may be suggested by those skilled in the art it is the intention of the inventors to embody within the patent warranted hereon all changes and modifications as reasonably and properly come within the scope of their contribution to the art.

We claim as our invention:

1. A structure for use in making a quality check of a substrate wafer consisting of semiconductor material produced from a larger semiconductor crystal, the substrate wafer to be employed for manufacturing chips having integrated circuits thereon, said structure comprising:

a plurality of field effect transistor structures disposed directly on a surface of said substrate wafer with the same density as the density of the functional components in said integrated circuit to be manufactured on said substrate wafer, said field effect transistors being disposed side by side on said substrate wafer;

each field effect transistor structure having an individual well structure within said substrate, and individual source structure, and an individual drain structure;

a plurality of terminal pads disposed at an edge region of said structure;

a plurality of conductors on said substrate respectively connecting a source and drain structure of a field effect transistor to one of said terminal pads, each of said conductors having dimensions such that the impedance of each conductor is substantially identical; and a single common gate conductor for common connection to all of said field effect transistor structures.

2. A structure as claimed in claim 1, wherein said gate conductor is connected to each field effect transistor structure at two opposite sides of said field effect transistor structure.

3. A structure as claimed in claim 1, wherein said gate conductor is connected to each field effect transistor structure via a Schottky gate contact.

4. A structure as claimed in claim 1, wherein at least a portion of said conductors are dimensioned for providing said identical resistance by a meandering path of selected length.

5. A structure as claimed in claim 1, wherein at least a portion of said conductors are dimensioned to obtain said identical resistance by an angled section of selected length.

6. A structure as claimed in claim 1, wherein said conductors are disposed on said substrate such that no conductor crosses another conductor.

7. A structure as claimed in claim 1, wherein said individual well structure for each field effect transistor structure is a doped region of said substrate wafer.

8. A structure as claimed in claim 1, wherein the semiconductor material of said wafer surrounding each individual well structure in said field effect transistor structures is electrically insulating.

* * * * *